United States Patent
Ahn et al.

(10) Patent No.: US 9,798,834 B2
(45) Date of Patent: Oct. 24, 2017

(54) APPARATUS AND A METHOD FOR ASSEMBLING A 3D MODEL

(75) Inventors: Han Sik Ahn, Seongnam (KR); Jeong Hoon Ahn, Yongin (KR); Je Young Hong, Goyang (KR); Jin Seung Jo, Gwangmyeong (KR)

(73) Assignee: SEMS GAMES CO., LTD., Seoul (KR)

( * ) Notice: Subject to any disclaimer, the term of this patent is extended or adjusted under 35 U.S.C. 154(b) by 739 days.

(21) Appl. No.: 14/126,968

(22) PCT Filed: Dec. 7, 2011

(86) PCT No.: PCT/KR2011/009438
§ 371 (c)(1),
(2), (4) Date: Dec. 17, 2013

(87) PCT Pub. No.: WO2013/022151
PCT Pub. Date: Feb. 14, 2013

(65) Prior Publication Data
US 2014/0129185 A1    May 8, 2014

(30) Foreign Application Priority Data

Aug. 8, 2011 (KR) .................. 10-2011-0078710

(51) Int. Cl.
*G06G 7/48* (2006.01)
*G06F 17/50* (2006.01)
*G06T 19/20* (2011.01)

(52) U.S. Cl.
CPC .............. *G06F 17/50* (2013.01); *G06T 19/20* (2013.01); *G06F 17/5009* (2013.01); *G06T 2219/2008* (2013.01)

(58) Field of Classification Search
CPC ... G05B 19/41805; G06F 17/50; G06T 19/00; G06T 17/005; A41H 3/007; A61B 5/4547
See application file for complete search history.

(56) References Cited

U.S. PATENT DOCUMENTS 7,698,014 B2 * 4/2010 Dunne ................ A61B 5/4547
                                                        433/25
8,473,259 B2 * 6/2013 Diguet ................... G06F 17/50
                                                        345/420
(Continued)

FOREIGN PATENT DOCUMENTS

KR    10-2000-0049975 A    8/2000
KR    10-2001-0107909 A    12/2001
(Continued)

OTHER PUBLICATIONS

International Search Report mailed Feb. 21, 2012 for PCT/KR2011/009438.

*Primary Examiner* — Kandasamy Thangavelu
(74) *Attorney, Agent, or Firm* — Studebaker & Brackett PC

(57) ABSTRACT

There are disclosed an apparatus for assembling a 3D model including a key input unit configured to generate a variety of key inputs for 3D model assembling or key data based on touch input on a screen; a control unit configured to drive an application to implement 3D model assembling based on the key input from the key input unit; a 3D model unit configured to provide a menu screen for 3D model assembling, when driven by the control unit, to display a screen of parts for a 3D model selected as an assembling object based on the touch or key input on the menu screen and to assemble parts selected from the part screen in successive steps to finish the 3D model; and a display unit configured to display successive screens based on the 3D model assembling performed by the 3D model unit.

17 Claims, 17 Drawing Sheets
(14 of 17 Drawing Sheet(s) Filed in Color)

(56) References Cited

U.S. PATENT DOCUMENTS

| | | | |
|---|---|---|---|
| 2001/0026272 A1* | 10/2001 | Feld | A41H 3/007 |
| | | | 345/419 |
| 2002/0089499 A1* | 7/2002 | Lee | G06T 17/005 |
| | | | 345/419 |
| 2007/0106410 A1* | 5/2007 | Bouffiou | G05B 19/41805 |
| | | | 700/97 |
| 2008/0082301 A1 | 4/2008 | Haskell | |
| 2008/0170070 A1* | 7/2008 | Yamagata | G06F 17/50 |
| | | | 345/420 |
| 2008/0183438 A1* | 7/2008 | Foster | G06T 19/00 |
| | | | 703/1 |
| 2011/0022208 A1* | 1/2011 | Bouffiou | G05B 19/41805 |
| | | | 700/98 |
| 2012/0110595 A1* | 5/2012 | Reitman | G06F 17/50 |
| | | | 719/313 |
| 2012/0130521 A1* | 5/2012 | Kohlhoff | G06T 19/00 |
| | | | 700/98 |

FOREIGN PATENT DOCUMENTS

| | | |
|---|---|---|
| KR | 10-2002-0059268 A | 7/2002 |
| KR | 10-2011-0034713 A | 4/2011 |

\* cited by examiner

APPARATUS AND A METHOD FOR ASSEMBLING A 3D MODEL

CROSS-REFERENCE TO PRIOR APPLICATIONS

This application is a national Stage Patent Application of PCT International Patent Application No. PCT/KR2011/009438, filed on Dec. 7, 2011 under 35 U.S.C. §371, which claims priority of Korean Patent Application No. 10-2011-0078710, filed on Aug. 8, 2011, which are all hereby incorporated by reference in their entirety.

BACKGROUND OF THE DISCLOSURE

Field of the Disclosure

The present invention relates to a method and apparatus for 3-dimensional (hereinafter, 3D) model assembling, more particularly, to an apparatus and method for assembling a 3-dimensional model based on 3-dimensional simulation for assembling various types of 3D models and processes of assembling the pieces in successive steps selected via user key input (e.g., touch input) on a screen of pieces for assembling an actual 3D model selected from various 3D models which can be virtually assembled on a terminal (e.g., a desktop computer, a notebook, a tablet computer, a smart phone and a PDA (Personal Digital Assistant)), without an actual purchase of plastic models.

Discussion of the Related Art

The present disclosure claims the priority of Korean Patent No. 10-2011-007810 filed on Aug. 8, 2011 and the descriptions disclosed in the specification and drawings of the application are applicable to the present disclosure.

Typically, 3-dimensional models are models realized actual or virtual structures 3-dimensionally. Such a 3-dimensional model may be a reduction model of an actual structure or a 3-dimensional graphic on a computer.

Various molecular structures used in the chemical field, various figures used in Mathematics, mechanic and electronic parts or plastic models.

Especially, plastic models mean constructible toys and a plastic model is provided with plastic parts to make a model of an airplane, a ship, a car or a robot. Referring to a manual for assembly of a product, a user assembles provided plastic parts in successive steps and makes the model of the product directly.

Such plastic models become more and more popular and appealing to all age groups, as user can make actual models of corresponding products directly, using plastic parts fabricated elaborately. Plastic models of all structures (e.g., airplanes, cars, ships and robots) are fabricated of various kinds of materials.

In case plastic parts of a plastic model are flimsy or a plastic model which will be made with plastic parts is simple, there are relatively low priced products. According to plastic models having a large size or a complicated structure requiring many plastic parts or accuracy of plastic parts, there are relatively high priced plastic models.

However, there is no way to actually purchase and assemble an actual plastic model of a wished product, even though a plastic model is so high priced to assemble a plastic model. The cost of the plastic model is employed as a factor for limiting opportunity of experiencing various plastic models. The high cost actual plastic model could not be assembled, when plastic parts are damaged or the user makes mistakes in assembling the plastic model. Accordingly, there might be disadvantages of wasting expense in the assembly of the plastic model and of failure in assembling the plastic model purchased with a high price.

SUMMARY OF THE DISCLOSURE

Accordingly, the embodiments may be directed to an apparatus for 3-dimensional model assembly and a method for the same. To solve the problems, an object of the embodiments is to provide an apparatus and method for assembling a 3-dimensional model based on 3-dimensional simulation for assembling various types of 3D models and processes of assembling the pieces selected via user key input (e.g., touch input) on a screen of pieces for assembling an actual 3D model selected from various 3D models which can be virtually assembled on a terminal (e.g., a desktop computer, a notebook, a tablet computer, a smart phone and a PDA (Personal Digital Assistant)), in successive steps, without an actual purchase of plastic models.

To achieve these objects and other advantages and in accordance with the purpose of the embodiments, as embodied and broadly described herein, an apparatus for assembling a 3D model includes a key input unit configured to generate a variety of key inputs for 3D model assembling or key data based on touch input on a screen; a control unit configured to drive an application to implement 3D model assembling based on the key input from the key input unit; a 3D model unit configured to provide a menu screen for 3D model assembling, when driven by the control unit, to display a screen of parts for a 3D model selected as an assembling object based on the touch or key input on the menu screen and to assemble parts selected from the part screen in successive steps to finish the 3D model; and a display unit configured to display successive screens based on the 3D model assembling performed by the 3D model unit.

The 3D model unit may include a menu screen configuration unit configured to configurate menu screens for the 3D model assembling; an input sensing unit configured to sense the user input touched on the menu screen; a part configuration unit configured to provide a screen of parts for the 3D model selected from the menu screen; and a 3D model assembling unit configured to receive input of parts selected from the part screen, and to perform assembling, in successive steps, corresponding to touch input of joints connecting the parts with one another, to assemble the 3D model into a finished product.

The 3D model assembling unit may move the parts selected from the part screen to an assembling tray for the assembling and perform the assembling, in successive steps, corresponding to the touch input of the joints connecting the parts with one another.

One assembling tray may be independently generated for each part selected from the part screen.

The assembling tray may include a waiting tray configured to display the part, when a part is selected from the part screen; an independent tray configured to transform a current state into a state where the assembling of the parts is performed, when parts which will be assembled to be a partial work are moved to the waiting tray; and a finishing tray configured to transform a current state into a state where temporarily store the finished partial works when the parts are assembled to be the partial work in the independent tray.

The 3D model unit may include a 3D model information database (DB) configured to store information on the parts of the 3D model; and a 3D model finished work DB configured to store information on the finished work of the 3D model.

The part configuration unit may provide the part screen based on part information of the selected 3D model read from the 3D model information DB.

Preferably, the 3D model unit may further include a 3D unit configured to realize a finished product of the 3D model.

The 3D model assembling unit may include a partial work assembling unit configured to perform assembling, corresponding to a joint touched on and two parts touched on indicating connection of two parts, after moving a part selected from the part screen to the assembling tray; and an intermediate work assembling unit configured to assemble an intermediate work based on a touch of the joint on partial works, after moving partial works selected from partial works assembled by the partial work assembling unit.

The intermediate assembling unit may repeatedly assemble an intermediate work sequentially selected to finish the 3D model out of the intermediate works and finish the assembling of the 3D model.

The apparatus may be a tablet computer, a desk top computer, a smart phone or a note book.

The 3D model may be a plastic model, a mechanical component model, an electronic component mode, a molecular model having a 3D shape or mathematical figure model.

In another aspect, an apparatus for assembling the 3D model includes a menu screen configuration unit configured to configure a menu screen for 3D model assembling; an input sensing unit configured to sense user input touched on the menu screen by the user; a part configuration unit configured to provide screen of parts for a 3D model selected from the menu screen; a 3D model assembling unit configured to assemble the 3D model into a finished product by receiving parts selected from the part screen and performing assembling based on touch input of joints connecting the parts with one another in successive steps.

The 3D model assembling unit may move the parts selected from the part screen to an assembling tray for the assembling and perform the assembling, in successive steps, corresponding to the touch input of the joints connecting the parts with one another.

One assembling tray may be independently generated for each part selected from the part screen.

The assembling tray may include a waiting tray configured to display the part, when a part is selected from the part screen; an independent tray configured to transform a current state into a state where the assembling of the parts is performed, when parts which will be assembled to be a partial work are moved to the waiting tray; and a finishing tray configured to transform a current state into a state where temporarily store the finished partial works when the parts are assembled to be the partial work in the independent tray.

Assembling of parts may be performed based on touch input of joints displayed on two parts as assembling objects in the independent tray.

Assembling of parts may be performed when one of the two parts is selected from the independent tray as the assembling objects and dragged to the other one closely within a predetermined range of distances.

The apparatus for assembling the 3D model may further include a 3D model information DB configured to store information on the parts of the 3D model; and a 3D model finished work DB configured to store information on the finished work of the 3D model.

The part configuration unit may provide the part screen based on part information of the selected 3D model read from the 3D model information DB.

Preferably, the 3D model unit may further include a 3D unit configured to realize a finished product of the 3D model.

The 3D model assembling unit may include a partial work assembling unit configured to perform assembling, corresponding to a joint touched on and two parts touched on indicating connection of two parts, after moving a part selected from the part screen to the assembling tray; and an intermediate work assembling unit configured to assemble an intermediate work based on touch of the joint on partial works, after moving partial works selected from partial works assembled by the partial work assembling unit.

The intermediate assembling unit may repeatedly assemble an intermediate work sequentially selected to finish the 3D model out of the intermediate works and finish the assembling of the 3D model.

The 3D model may be a plastic model, a mechanical component model, an electronic component mode, a molecular model having a 3D shape or mathematical figure model.

In a further aspect, a method for assembling a 3D model includes receiving input of a request to implement an application for 3D model assembling; displaying a menu screen for the 3D model assembling by driving the application requested to implement; receiving selection of a 3D model as an assembling object from the menu screen; displaying a screen of parts for the selected 3D model; and assembling the 3D model, using the parts selected from the part screen.

The assembling of the 3D model may include generating a screen of parts for the 3D model selected from the menu screen; receiving input of parts selected from the part screen; and assembling the 3D model into a finished product by performing the assembling based on touch input of joints connecting the selected parts with one another in successive steps.

The assembling of the 3D model into the finished product may include assembling a partial work based on touch of joints touched on each of the parts, after moving parts selected from the part screen to the assembling tray; assembling an intermediate work based on touch of joints touched on each of the parts, after moving the partial work selected from the assembled partial works; and finishing the assembling of the 3D model by repeatedly assembling the intermediate work sequentially selected out of the intermediate works to finish the 3D model.

A single assembling tray may be independently generated for each of the parts selected from the part screen.

The assembling tray may include a waiting tray configured to display the part, when a part is selected from the part screen; an independent tray configured to transform a current state into a state where the assembling of the parts is performed, when parts which will be assembled to be a partial work are moved to the waiting tray; and a finishing tray configured to transform a current state into a state where temporarily store the finished partial works when the parts are assembled to be the partial work in the independent tray.

The 3D model may be a plastic model, a mechanical component model, an electronic component mode, a molecular model having a 3D shape or mathematical figure model.

Accordingly, the embodiments of the present disclosure may provide an apparatus and method for assembling a 3-dimensional model based on 3-dimensional simulation for assembling various types of 3D models and processes of assembling the pieces selected via user key input (e.g., touch input) on a screen of pieces for assembling an actual 3D model selected from various 3D models which can be virtually assembled on a terminal (e.g., a desktop computer, a notebook, a tablet computer, a smart phone and a PDA (Personal Digital Assistant)), in successive steps, without an actual purchase of plastic models.

It is to be understood that both the foregoing general description and the following detailed description of the embodiments or arrangements are exemplary and explanatory and are intended to provide further explanation of the embodiments as claimed.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
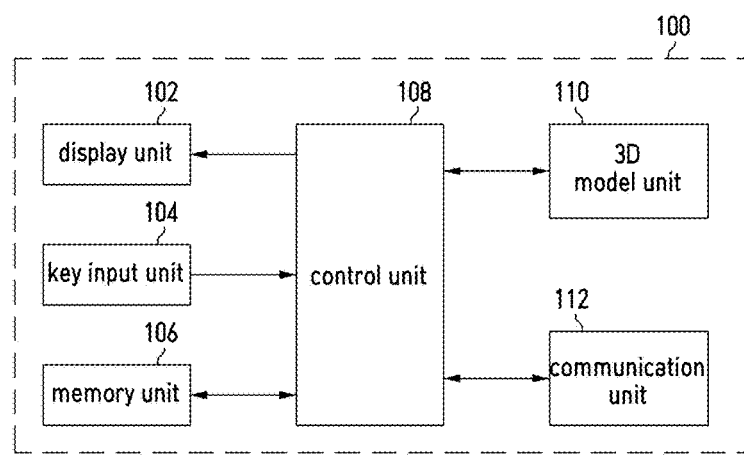
FIG. 1 is a block diagram of a terminal device which may implement virtual assembly of 3-dimensional model according to exemplary embodiments of the present disclosure.

Reference may now be made in detail to specific embodiments, examples of which may be illustrated in the accompanying drawings. Wherever possible, same reference numbers may be used throughout the drawings to refer to the same or like parts. Specific embodiments will be explained in the drawings and the detailed description. However, it is to be understood that the invention is not limited in its application to the details of constriction and the arrangement of components set forth in the following description or illustrated in the following drawings. Reference may now be made in detail to specific embodiments, examples of which may be illustrated in the accompanying drawings. Wherever possible, same reference numbers may be used throughout the drawings to refer to the same or like parts.

FIG. 1 is a block diagram of a terminal device which may implement virtual assembly of 3-dimensional model according to exemplary embodiments of the present disclosure. At this time, the terminal device may include a device (e.g., a computer) having a display (e.g., LCD) and a processor for processing a signal to process 3D simulation of a plastic model. In other words, the terminal device may include a desktop computer, a notebook and a tablet computer (e.g., IPad and Galaxy tab). Also, the terminal device may include a mobile terminal (e.g., a cellular phone and a smart phone).

Referring to FIG. 1, operations of elements provided in the terminal device according to the present disclosure are described. In exemplary embodiments, an assembling process of a plastic model out of 3-dimensional models is described.

First of all, a key input unit 104 may include a plurality of number keys and function keys for various operation requests of a terminal device 100. Key data corresponding to a key pressed by a user may be generated and output to a control unit 108. Character arrangement in the key input unit 104 may be changed according to regional settings and manufacturers. The key input unit 104 may be displayed on a touch screen of a display 102 in a tablet computer (e.g., a smart phone and an IPad) in software manners, instead of a physical keypad.

The display 102 displays a variety of information on the terminal device 100 by control of the control unit 108. The key data generated from the key input unit 104 and the various information signals of the control unit 108 are input and displayed on the display 102. In case of implementing an application for 3-dimensional model, for example, plastic model assembling according to the embodiment of the present disclosure, screens of successive plastic model assembling processes are displayed on the display 102.

The control unit 108 controls overall operations of the terminal device 100 based on operation programs stored in a memory unit 106. The operation programs refer to a basic operating system required to operate the terminal 100 and software programmed in advance when manufacturing the terminal 100 to connect the display 102 and the key input unit 104 with one another, to manage input/output of data or to implement applications of the terminal 100.

The control unit 108 drives a 3-dimensional model unit 110 configured to perform virtual assembly of a plastic model on 3D simulation display, when a key input is made from the key input unit 104 to implement plastic model assembling.

A communication unit 112 is configured to link the terminal 100 to a communication network (e.g., an internet) wirelessly or through a cable. The control unit 108 may transform the plastic model assembled through the terminal 100 according to the user's key input request to a variety of social medias (e.g., Facebook and Twitter) selected by the user.

A 3D model unit 110 is the application configured to assemble a variety of plastic models (e.g., an airplane, a car, a ship and a robot) virtually. The 3D model unit 110 may be pre-programmed in the terminal 100, when manufacturing the terminal, or downloaded to the terminal 100 through the communication unit 112, after manufacturing the terminal 100.

When driven by the control unit 108, the 3D model unit 110 displays a menu screen configured to assemble the plastic model on the display 102 such that the user of the terminal 100 may implement the assembling of the plastic model. In other words, when it is driven by the control unit 108, the 3D model unit 110 provides a menu screen for the plastic model assembling and displays a screen of parts for a plastic model selected as an assembling object according to key input through the key input unit 104 or touch input on the menu screen. After that, a part selected from the part screen is assembled in successive steps and the plastic model is made completely, only to display the completed plastic model.

Figure 2:
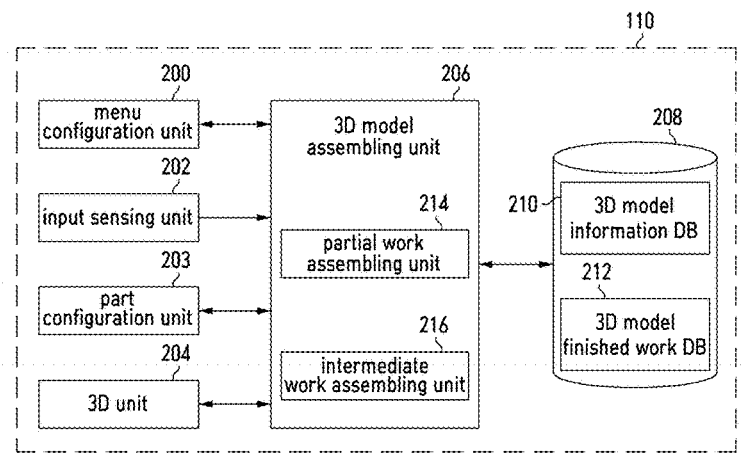
FIG. 2 is a block diagram of a 3-dimensional model unit according to exemplary embodiments of the present disclosure.

FIG. 2 is a block diagram of the 3D model unit 110 shown in FIG. 1 according to the embodiments of the present disclosure. The 3D model unit 110 includes a menu configuration unit 200, an input sensing unit 202, a part configuration unit 203, 3D unit 204, a 3D model assembling unit 206 and a database 208.

Referring to FIG. 2, operations of the elements composing the 3D model unit 206 will be described.

Figure 3:
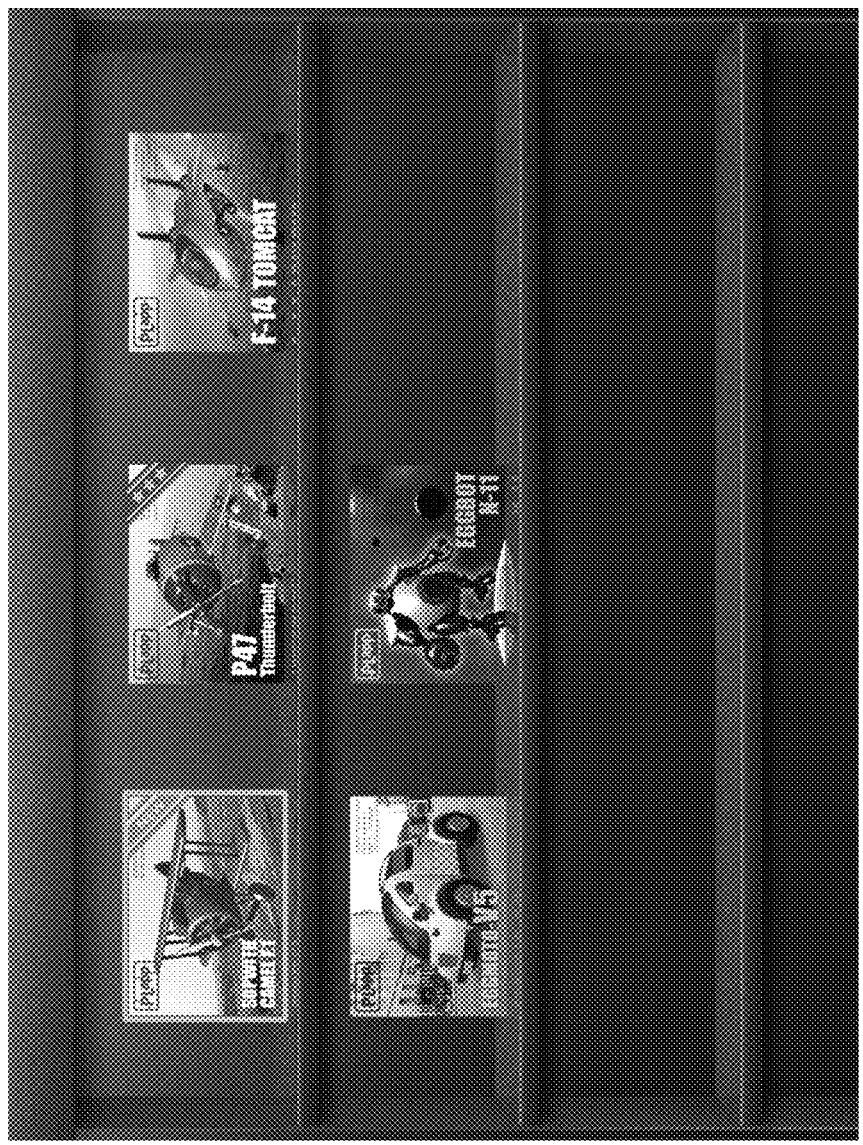
FIG. 3 is a diagram illustrating a menu screen to assemble a 3-dimensional model.

First of all, the menu configuration unit 200 provides a menu screen to enable the assembling of a plastic model as one of the 3D models on the terminal 100. FIG. 3 illustrates the menu screen for assembling the plastic model. As shown in FIG. 3, various plastic models provided by the terminal 100 (e.g., an airplane, a ship, a car and a robot) may be realized. Accordingly, the user selects a desired plastic model, using key input or touch input, such that the user can implement an assembling process of the corresponding plastic model virtually.

The input sensing unit 202 senses the key or touch inputted in the menu screen by the user and provides the sensed user input to the 3D model assembling unit 206.

Figure 4:
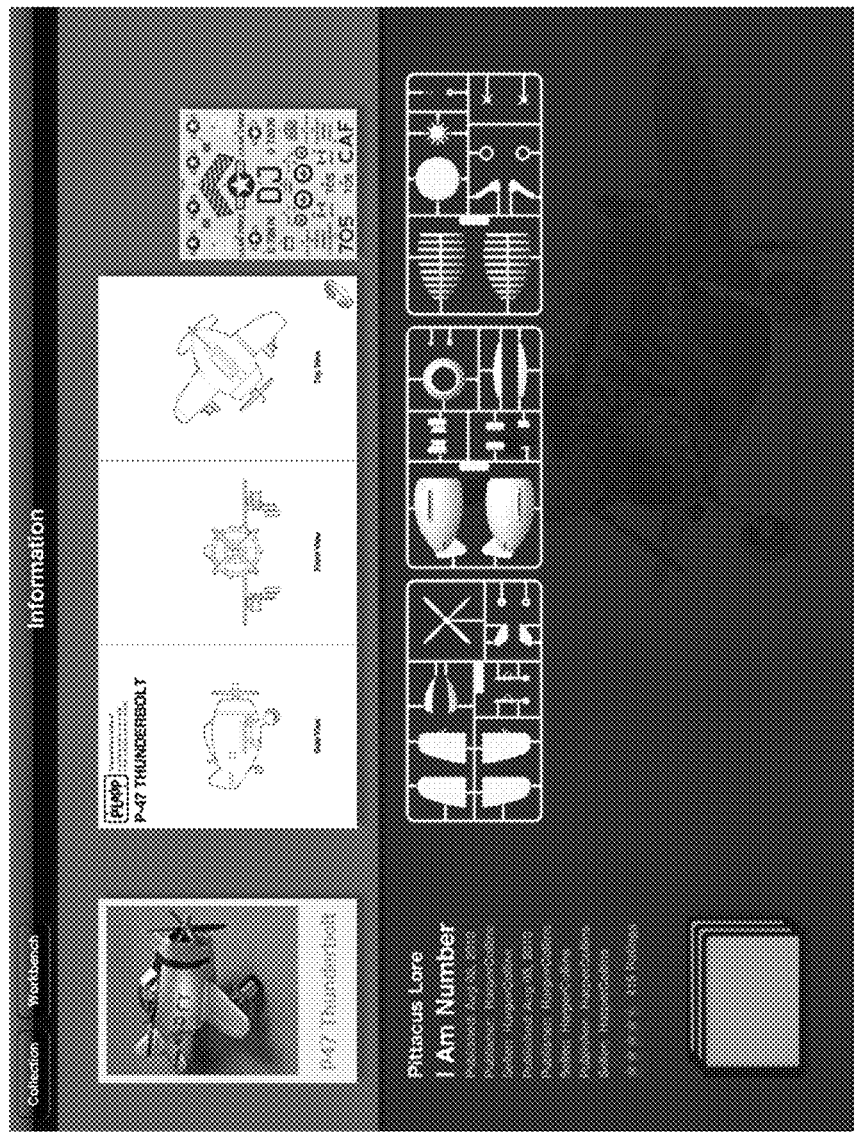
FIG. 4 is a diagram of a screen displaying a single module and a manual for the 3-dimensional model according to the embodiments of the present disclosure.

The part configuration unit 203 recognizes the plastic model sensed as a selected model by the input sensing unit 202 and reads information on the corresponding plastic model, in other words, information on the list of parts for the corresponding plastic model from a 3D model information database (DB) 210 provided in the database 208, to create a part screen and an assembly manual shown in FIG. 4. The 3D unit 204 simulates the completed plastic model from the 3D model assembling unit 206, to create a 3D model.

The 3D model assembling unit 206 moves two or more parts selected from the screen of the parts to an assembling tray and assembles the parts based on joint input received from the user. After that, the two or more parts are assembled for an intermediate product. Such assembled intermediate products are assembled in successive steps, until the corresponding plastic model is completely assembled, such that a completely assembled product may be made and displayed. At this time, in manners of connecting the joints, one joint is touched and the other joint is touched to implement the assembling. One of two parts configured to be assembled on the assembling tray is selected through touch and moved a predetermined distance toward the other part. In this instance, the two parts may be automatically assembled.

The 3D model assembling unit 206 may include a partially assembled work assembling unit 214 (hereinafter, a partial work assembling unit 214) and an intermediately assembled work assembling unit 216 (hereinafter, an intermediate work assembling unit 216) shown in FIG. 2.

Hereinafter, the operation of the 3D model assembling unit 206 will be described in detail by describing operations of the partial work assembling unit 214 and the intermediate product assembling unit 216.

First of all, two or more parts are selected from the partial work assembling unit 214 shown in FIG. 5 by the user and the selected parts are removed from a frame (hereinafter, "a runner" for fixing parts. The removed parts are moved to the screen of the assembling tray and the partial work assembling unit 214 receives touch input for a joint connecting the corresponding parts from the assembling tray. The corresponding parts are initially assembled to be a partial work.

Figure 6:
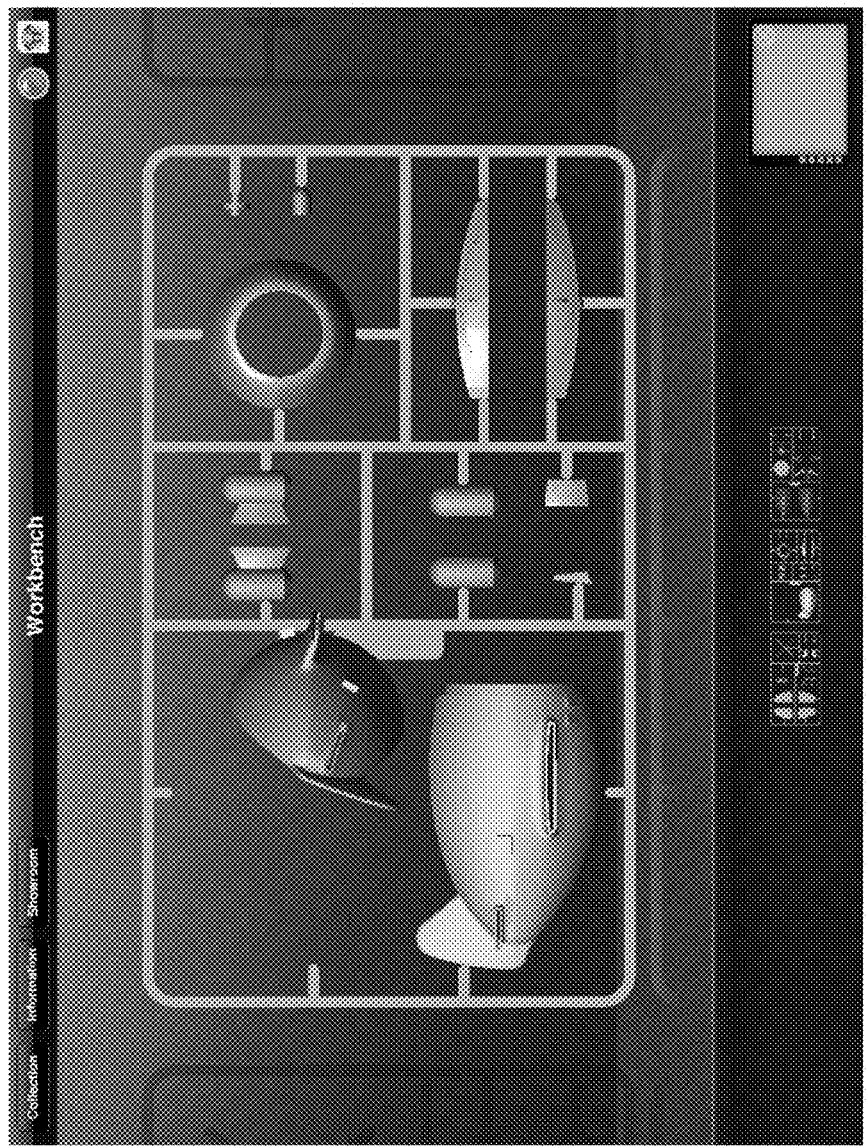
FIG. 6 is a diagram of a screen displaying a selected single module of the 3-dimensional model according to the embodiments of the present disclosure.
Figure 7:
FIG. 7 is a diagram of a screen displaying an assembly tray for forming parts of the 3-dimensional model according to the embodiments of the present disclosure.

FIG. 6 is a diagram illustrating the screen of the parts selected by the user which is removed from the runner. FIG. 7 is a diagram illustrating the screen that the parts selected by the user are removed from the runner.

As shown in FIG. 7, a joint is displayed on the parts moved toward the assembling tray screen to join parts to each other. When the joints are selected from the parts by the user through touch input, a first partial work connected via the corresponding joint portion shown in FIG. 8 may be displayed.

Figure 8:
FIG. 8 is a diagram of a screen configured to form the parts of the 3-dimensional model according to the embodiments of the present disclosure.

At this time, FIG. 8 illustrates the screen displaying the first partial work after a joint is precisely selected. When a wrong joint for the first partial work is selected by lack of user understanding or touch mistake, the partial work assembling unit 214 shown in FIG. 8 displays a joint error to allow the user to sequentially select a joint, without displaying the configuration of the first partial work.

The intermediate part assembling unit 216 moves parts selected to assemble a second assembled part or more assembled parts out of the first assembled parts assembled in the partial work assembling unit 214 toward the assembling tray. After that, the intermediate part assembling unit 216 receives touch input for a joint connecting the first assembled parts with one another on the assembling tray screen and the corresponding parts are subsequently assembled according to an input joint and an intermediate part is formed.

Figure 9:
FIG. 9 is a diagram of a screen displaying an assembly tray for forming an intermediate assembled part of the 3-dimensional model according to the embodiments of the present disclosure.

FIG. 9 illustrates a screen of two or more parts of the assembling tray moved and displayed to assemble the intermediate assembled part. As shown in FIG. 9, joints for connecting parts with one another are displayed on the partial work moved to the screen of the assembling tray, similar to the process of assembling the part initially. When a joint on the parts is selected by user touch input, a subsequently assembled intermediate assembled work connected via the corresponding joint may be displayed as shown in FIG. 10.

Figure 10:
FIG. 10 is a diagram of a screen displaying the intermediate-assembled part of the 3-dimensional model according to the embodiments of the present disclosure.

At this time, FIG. 10 illustrates a screen of the intermediate assembled work assembled after the proper joint is selected. Similar to the partial work, when a wrong joint for the second intermediate assembled work is selected by the user's misunderstanding or touch error, the intermediate assembled work assembling unit 216 displays joint error, not displaying the configuration of the subsequently assembled intermediate work shown in FIG. 10, only to allow the user to sequentially select a joint.

The intermediate work subsequently assembled in the intermediate work assembling unit may be assembled to be a completed plastic model in the second assembling.

However, in case the intermediate work made by the assembling of the second partial work, the intermediate work assembling unit performs a third or fourth partial work assembling of the intermediate work in successive steps to completely make the plastic model.

Specifically, the intermediate work assembling unit 216 moves an intermediate work selected to assemble the finished product to the screen of the assembling tray. After that, the intermediate work assembling unit 216 receives user touch input for joints connecting the intermediate works with one another and assembles the corresponding intermediate work, corresponding to the input joint. Such the assembling of the intermediate work is performed in successive steps by the intermediate work assembling unit 216, until the corresponding plastic model is finished. When the finished product is made through the continuous assembling process of the intermediate works, the intermediate work assembling unit 216 stores the finished plastic model shown in FIG. 11 in a 3D model finished product DB 212 provided in the database 208 and displayed by 3D simulation.

FIGS. 12, 13, 14, 15 and 16 illustrate a screen of an assembling tray for each of the assembling steps according to exemplary embodiments of the present disclosure. FIGS. 12 to 16 illustrate the screen of the assembling tray displayed in the process of assembling parts into a partial work made in the partial work assembling unit. The screen may be applied to a process of assembling the partial works into a finished product. Hereinafter, referring to FIGS. 12, 13, 14, and 16, the operation of the assembling tray for assembling the partial work will be described in detail.

Figure 12:
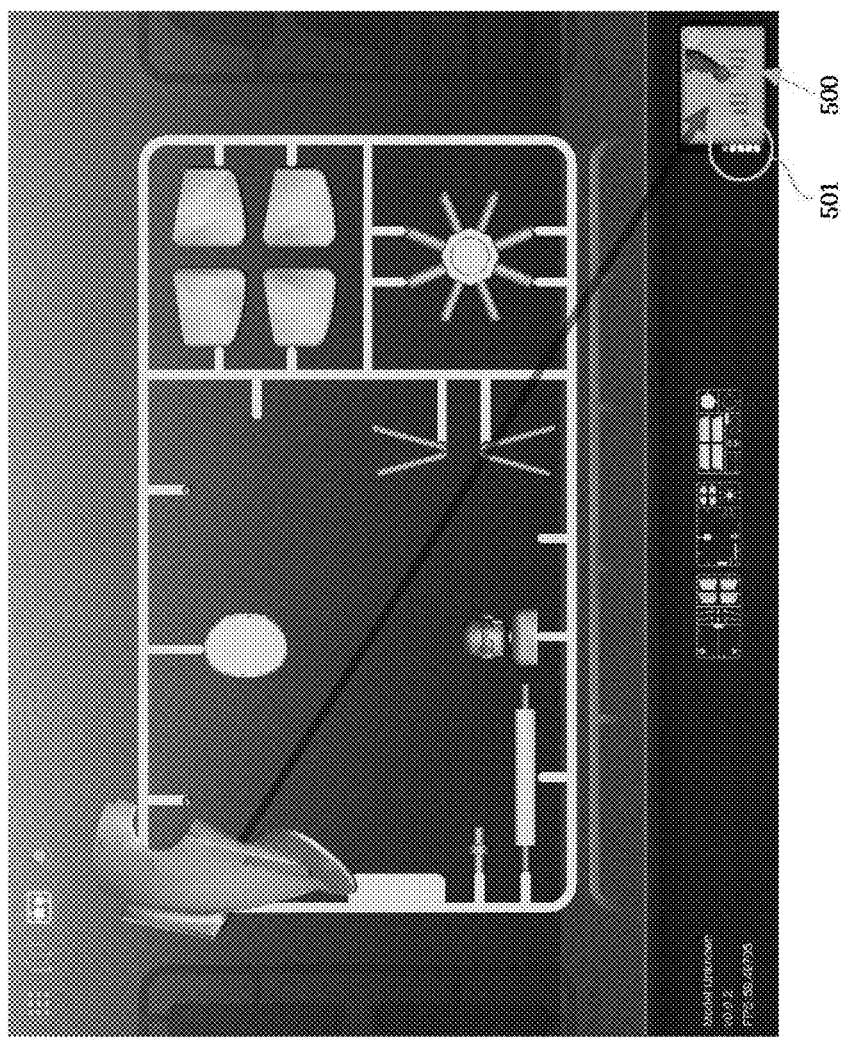
FIGS. 12, 13, 14, 15 and 16 are diagrams illustrating an operation of the assembly tray according to the embodiments of the present disclosure.

First of all, when a part is selected from the runner which is the screen of the parts, a screen of the assembling tray is generated to temporarily store the selected part and the selected part is moved to a screen of the assembling tray displayed under the rubber as shown in FIG. 12. At this time, the assembling tray where the selected part is moved may be a waiting tray 500 and the number 501 of parts required to assemble a partial work may be displayed on one surface of the waiting tray 500.

Figure 13:
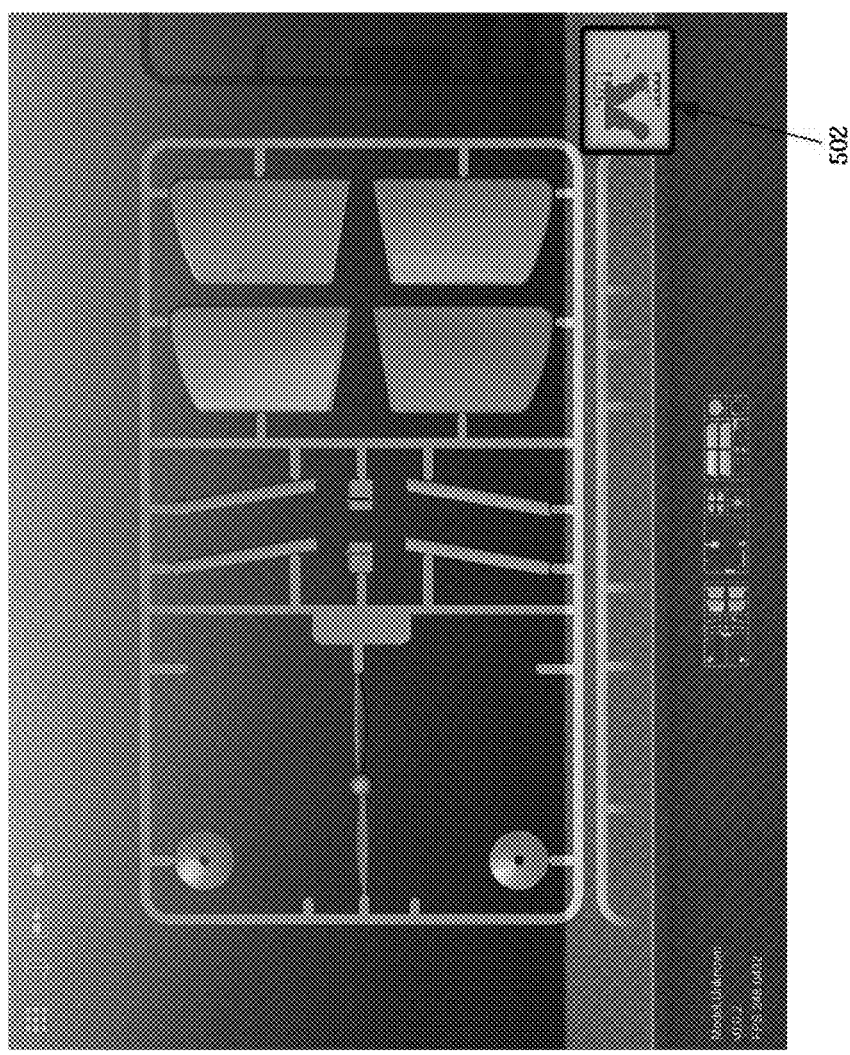

Hence, when all of the parts for assembling the partial work are selected and moved to the waiting tray 500, the waiting tray 500 is changed into an independent tray 502 shown in FIG. 13 and the state is transformed into a state where parts can be assembled through a joint between the parts.

Figure 14:
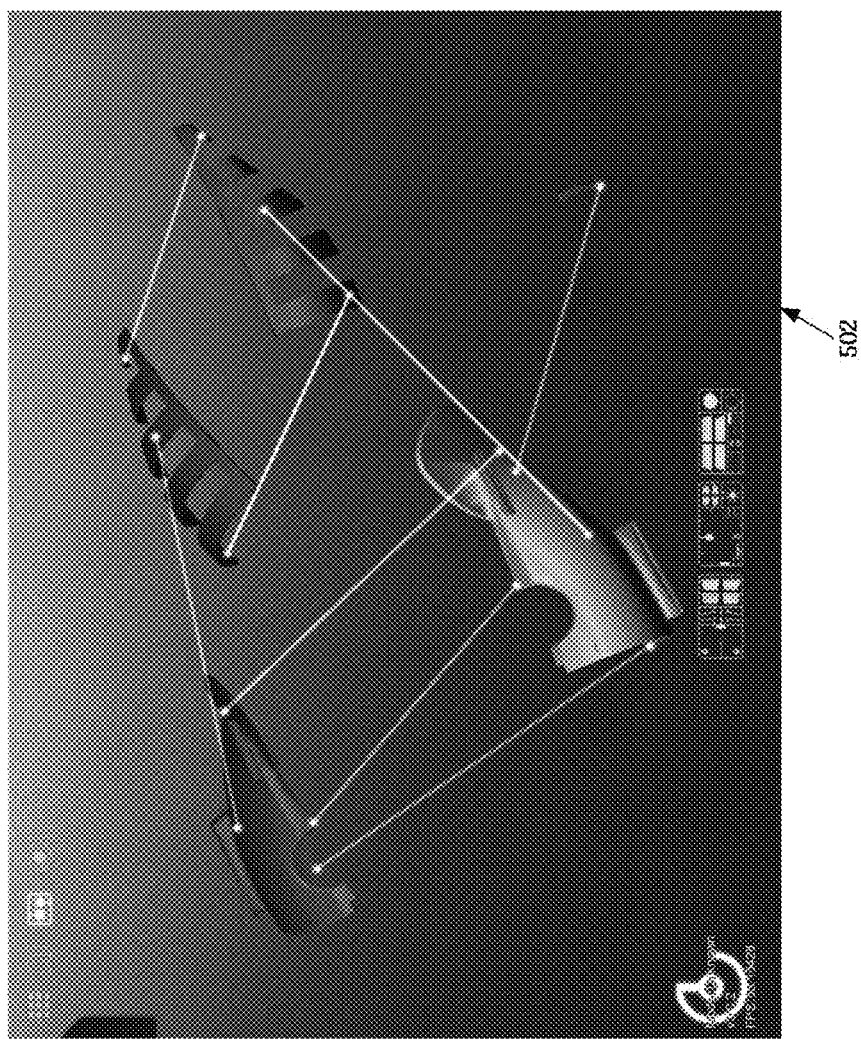

At this time, when user input (e.g., touch on a screen of the independent tray 502 is sensed, the parts displayed in the independent tray 502 are transformed into a state where the parts can be assembled into a partial work shown in FIG. 14. Joints for connecting the parts with one another may be displayed in the independent tray 502.

Accordingly, the user may select a joint which will connect parts with one another through user input (e.g., touch) again. When the selection input for the joints is received from the user, the appearance of the partial work via the joints are shown in FIG. 15.

Figure 15:
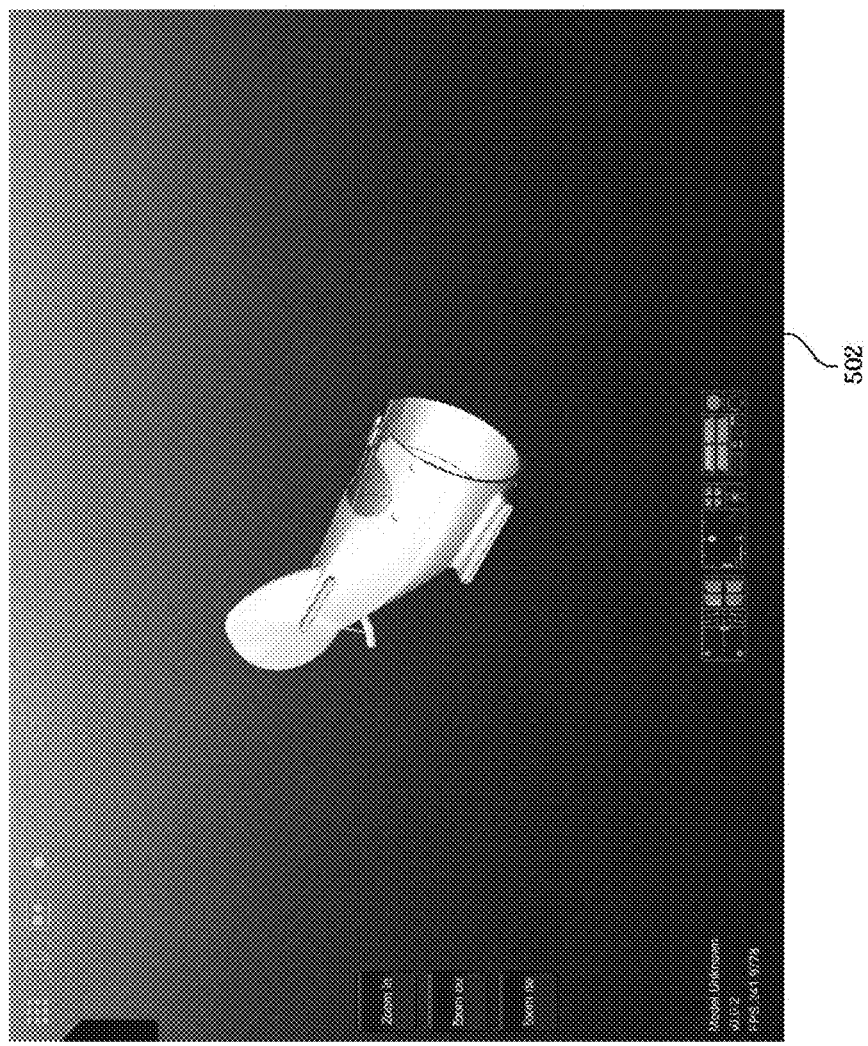
Figure 16:
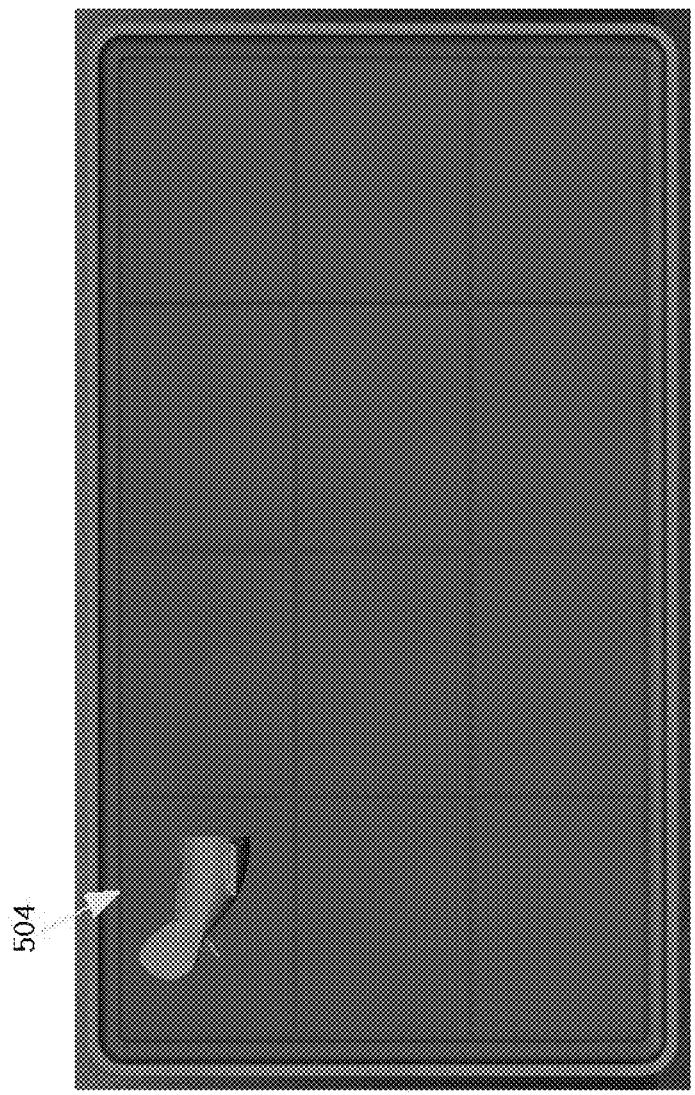

When the assembling of the parts shown in FIG. 15 is performed successfully, the state of the independent tray 502 where the assembling of the parts can be performed is transformed into a finishing tray 504 displaying the assembled parts shown in FIG. 16.

The finishing tray 504 may be generated for each of the parts and stored temporarily. The finishing tray 504 may be a configuration for assembling the intermediate work in the process of assembling the finished product of the plastic model. When selected by the user like the selection of the parts, the finishing tray 504 may be used as a partial work moved to the waiting tray on the screen of the assembling tray.

Figure 11:
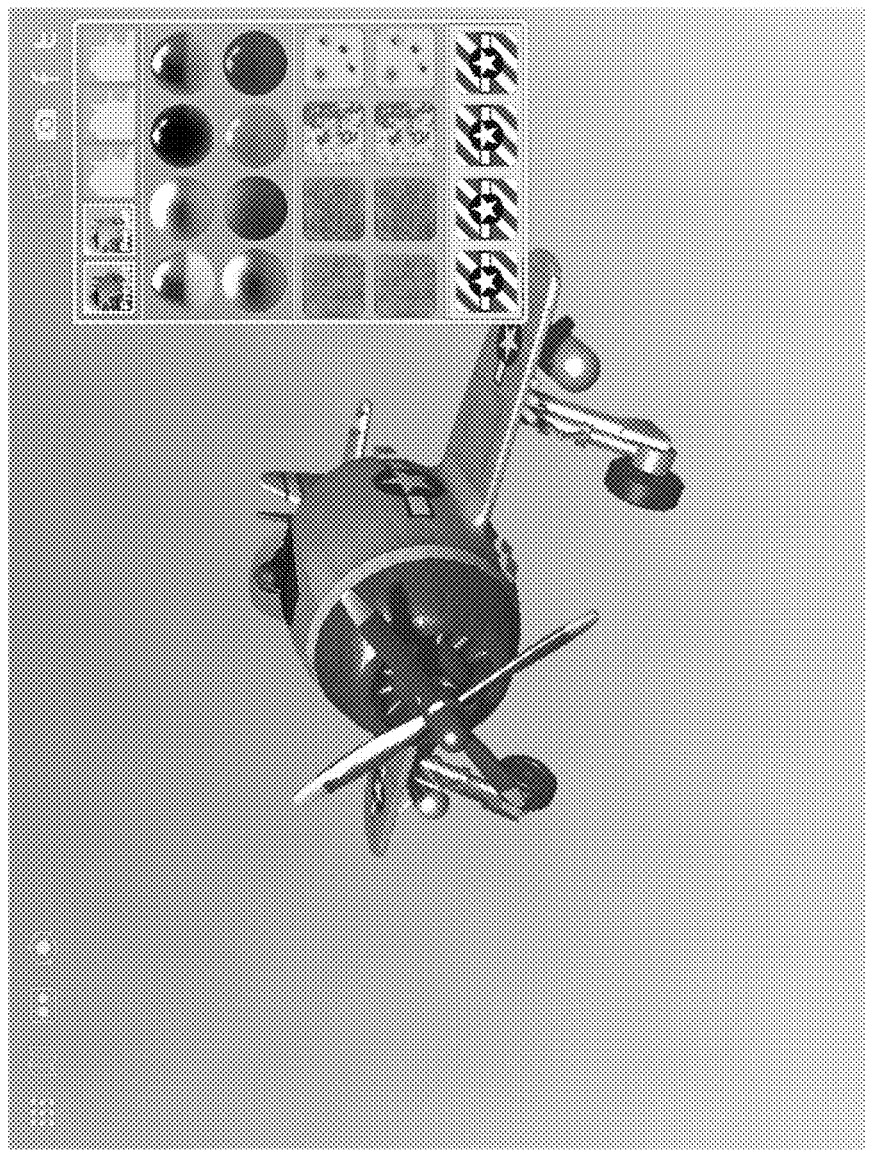
FIG. 11 is a diagram of a screen displaying the finished product of the 3-dimentional model according to the embodiments of the present disclosure.

The intermediate work assembling unit 216 may provide a mode for coloring the plastic model shown in FIG. 11, following the user's taste. The plastic model may be colored with a color selected by the user and various symbols or pictures may be inserted in predetermined stored positions.

In the coloring process, the intermediate work assembling work 216 may provide only a function for coloring various colors selected by the user on 3D model such as the finished plastic model but also a function of applying various effects.

For example, chrome, silver, gold, bronze, wood, glass and other various materials may be applied to a surface of the 3D model. The material as well as the color may be selected by the user.

Figure 17A:
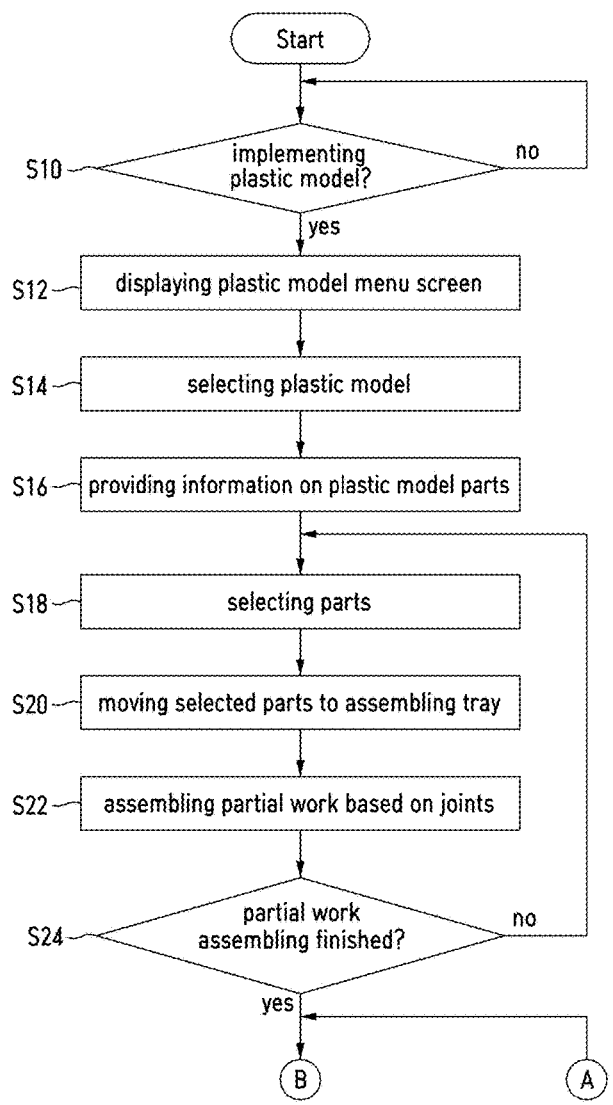
FIGS. 17a and 17b are flow charts illustrating control operation of the 3-dimensional model assembly according to the embodiments of the present disclosure.
Figure 17B:
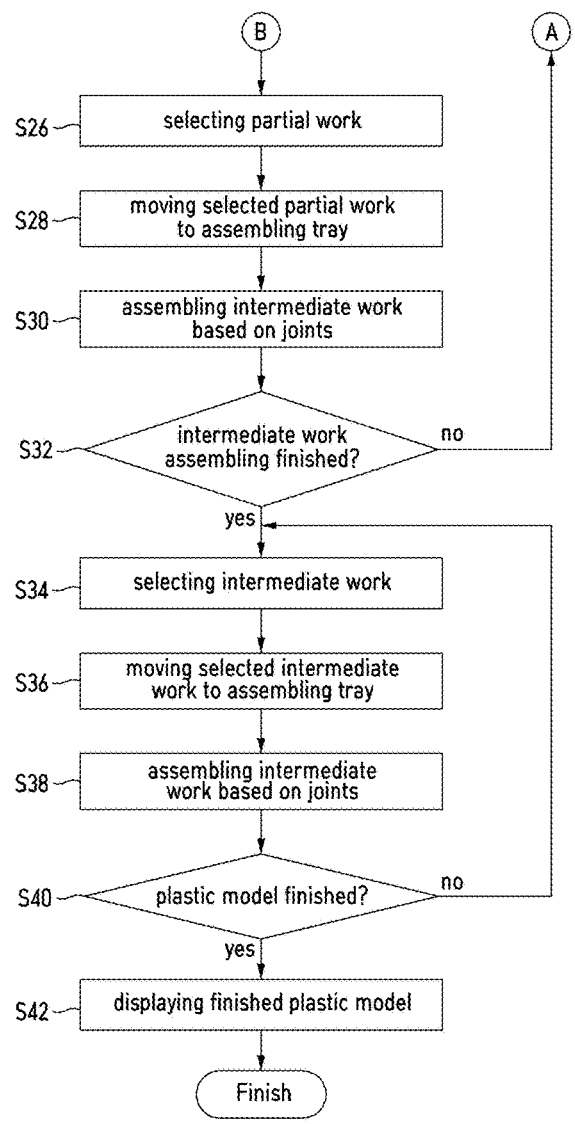

FIG. 17*a* and FIG. 17*b* are flow charts illustrating an operation control process of assembling the 3D model in the terminal virtually. Referring to FIGS. 1, 17*a* and 17*b*, the exemplary embodiments will be described in detail. In the following description, an assembling operation of a plastic model out of 3D models will be described.

First of all, when key input for implementing plastic model assembling is generated from the terminal 100 where virtual assembling simulation of a plastic model can be performed (S10), the control unit 108 of the terminal 100 drives the 3D model unit 110 configured to implement virtual assembling of the plastic model and the assembling process of the plastic model may be implemented in the terminal 100.

Hence, the 3D model unit 110 is driven by the control unit 108 and the menu configuration unit 200 provided in the 3D model unit 110 configurates a menu screen for the plastic model assembling and the menu screen is displayed on the display 102 of the terminal (S12).

As shown in FIG. 3, the various plastic models realized as an airplane, a ship, a car and a robot) provided by the terminal 100 may be displayed. Accordingly, the user may select a desired plastic model through key input or touch input and an assembling operation for the corresponding plastic model may be implemented virtually.

Once the plastic model which will be assembled is selected from the menu screen by the user (S14), the input sensing unit 202 senses the touch or key input from the menu screen and provides plastic model selection information to the 3D model assembling unit 206.

After that, the part configuration unit 203 recognizes the plastic model sensed to be selected by the user in the input from the variety of the plastic models arranged on a shelf-shaped screen of the menu screen. The part configuration unit 203 reads information on the selected plastic model, in other words, part information of the plastic model from the 3D model information DB 210 provided in the database 208 and displays a screen configured of an part screen and an assembling manual (S16).

Figure 5:
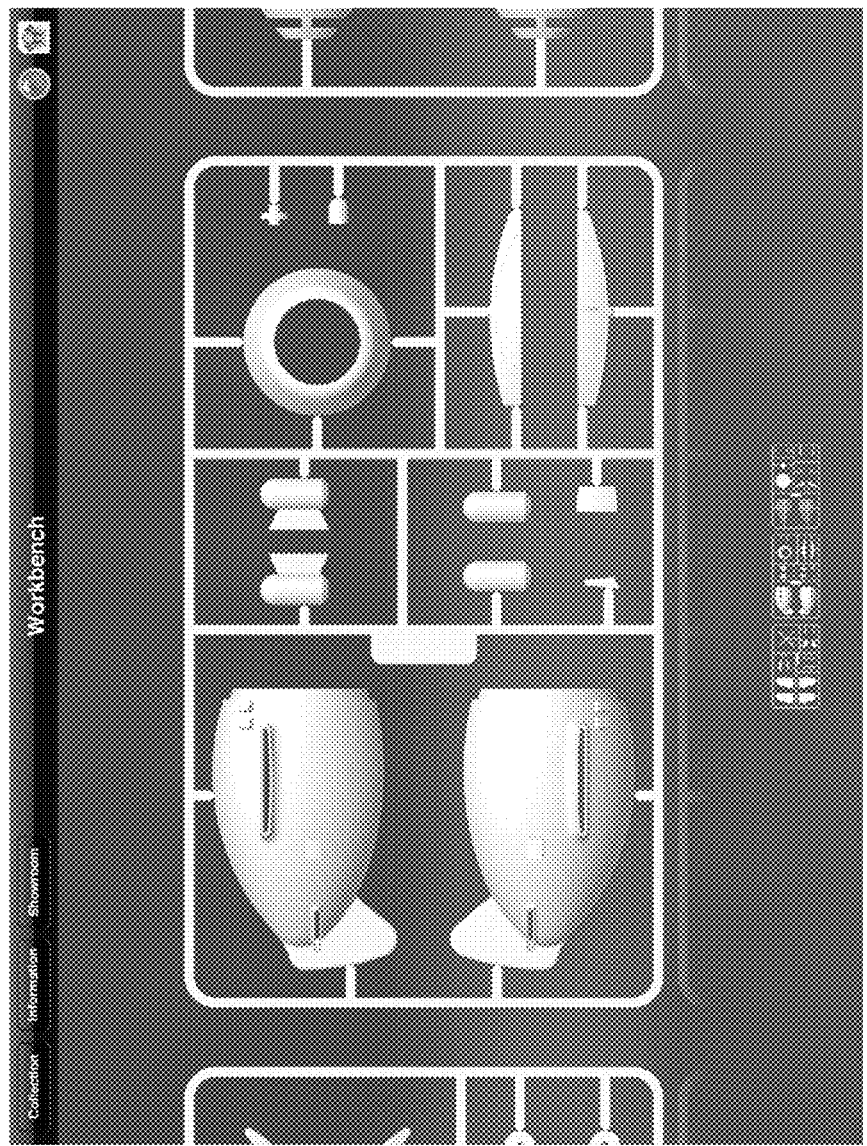
FIG. 5 is a diagram of a screen displaying a single module of the 3-dimensional model according to the embodiments of the present disclosure.

Accordingly, the user selects the part screen located in a lower portion of the screen displayed in FIG. 4 through touch and generates the part screen shown in FIG. 5. After that, the user may select a specific part for assembling the plastic model.

The partial work assembling unit 214 of the 3D model assembling unit 206 is provided with information on the parts selected from the part screen by the user as shown in FIG. 5 (S18). The selected part is selected from the rubber fixing the parts and the selected part is moved to the assembling tray screen shown in FIG. 7 (S20).

After that, the partial work assembling unit 214 receives touch input for a joint connecting the parts with one another on the assembling tray screen shown in FIG. 7. The parts corresponding to the input joint may be assembled initially and a partial work is formed (S22).

The process of assembling the partial work performed by the partial work assembling unit 214 is implemented until all of the parts are selected from the part screen and assembled. In other words, the partial work assembling unit 214 examines whether all of the parts are selected from the part screen to be assembled into the partial work (S24) and performs the process of the assembling all of the parts into the partial product (S18-S22).

When the assembling of the partial product is finished, the intermediate product assembling unit 216 receives input for the partial product selected by the user to assemble the initially assembled partial product into the intermediate work as the subsequently assembled work (S26).

Hence, the intermediate work assembling unit 216 moves the parts selected by the user to the assembling tray screen shown in FIG. 9 (S28) and receives touch input for the joints for connecting the initially assembled works with one another on the assembling tray screen to assemble the corresponding parts subsequently, corresponding to the input joints, only to form the intermediate work shown in FIG. 10 (S30).

At this time, the intermediate work assembling process performed by the intermediate work assembling unit 216 is performed until all of the initially assembled parts are assembled. In other words, the intermediate work assembling unit 216 examines whether all of the partial works are selected and assembled into the intermediate works (S32) and performs the process of assembling all the partial works into the intermediate works repeatedly (S26-S30).

When the first intermediate work assembling is finished, the first intermediate work may be a finished product according to types of the plastic model, or after second, third or more intermediate works, the finished product may be made. Accordingly, the intermediate work assembling unit 216 performs the intermediate work assembling repeatedly until the plastic model is finished, when the first intermediate work is not the finished product.

In other words, the intermediate work assembling unit 216 receives input of intermediate work parts selected from parts of the second assembled intermediate work for the finished product assembling (S34).

After moving the intermediate work selected by the user to the assembling tray (S36), the intermediate work assembling unit 216 receives touch input of joints for connecting the intermediate works with one another on the assembling tray screen and assembles the selected intermediate works, corresponding to the input joints (S38).

The assembling process performed by the intermediate work assembling unit 216 may be performed in successive steps, until the corresponding plastic model is finished. That is, the intermediate work assembling unit 216 examines whether the plastic model is finished (S40) and performs the assembling process of the intermediate works in successive steps until the plastic model is finished (S34-S38).

When the plastic model is finished, the intermediate work assembling unit 216 stores the finished plastic model in the 3D model finished product DB 212 provided in the database 208, only to simulate and display the finished plastic model in 3D.

After the plastic model is finished, the intermediate work assembling unit 216 provides the mode configured to color the plastic model with colors according to the user's selection, such that the user can color the plastic model with the colors selected by the user and various symbols or pictures stored in preset positions may be inserted.

Chrome, silver, gold, bronze, wood, glass and other various materials may be applied to the surface of the plastic model. Accordingly, the user may select not only the color but also the material.

As mentioned above, the exemplary embodiments of the present disclosure may provide to an apparatus and method for assembling a 3-dimensional model based on 3-dimensional simulation for assembling various types of 3D models and processes of assembling the pieces selected via user key input (e.g., touch input) on a screen of pieces for assembling an actual 3D model selected from various 3D models which can be virtually assembled on a terminal (e.g., a desktop computer, a notebook, a tablet computer, a smart phone and a PDA (Personal Digital Assistant)), in successive steps, without an actual purchase of plastic models.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for assembling a 3D model comprising:
   a key input unit configured to generate a variety of key inputs for 3D model assembling or key data based on touch input on a screen;
   a control unit configured to drive an application to implement 3D model assembling based on the key input from the key input unit;
   a 3D model unit configured to provide a menu screen for 3D model assembling, when driven by the control unit, to display a screen of parts for a 3D model selected as an assembling object based on the touch or key input on the menu screen and to assemble parts selected from the part screen in successive steps to finish the 3D model; and
   a display unit configured to display successive screens based on the 3D model assembling performed by the 3D model unit,
   wherein the 3D model unit comprises:
      a menu screen configuration unit configured to configure menu screens for the 3D model assembling;
      an input sensing unit configured to sense the user input touched on the menu screen;
      a part configuration unit configured to provide a screen of parts for the 3D model selected from the menu screen; and
      a 3D model assembling unit configured to receive input of parts selected from the part screen, to perform assembling in successive steps, corresponding to touch input of joints connecting the parts with one another to assemble the 3D model into a finished product,
   wherein the 3D model assembling unit moves the parts selected from the part screen to an assembling tray for the assembling and performs the assembling in successive steps, corresponding to the touch input of the joints connecting the parts with one another,
   wherein one assembling tray is independently generated for each part selected from the part screen, and
   wherein the assembling tray comprises:
      a waiting tray configured to display the part, when a part is selected from the part screen;
      an independent tray configured to display a transformation into a state where the assembling of the parts is performed, when parts which will be assembled to be a partial work are moved from the waiting tray; and
      a finishing tray configured to display temporarily stored finished partial works when the parts are assembled to be the partial work in the independent tray.

2. The apparatus for assembling the 3D model according to claim 1, wherein the 3D model unit comprises,
   a 3D model information database (DB) configured to store information on the parts of the 3D model; and
   a 3D model finished work DB configured to store information on the finished work of the 3D model.

3. The apparatus for assembling the 3D model according to claim 2, wherein the part configuration unit provides the part screen based on part information of the selected 3D model read from the 3D model information DB.

4. The apparatus for assembling the 3D model according to claim 1, wherein the 3D model assembling unit comprises,
   a partial work assembling unit configured to perform assembling, corresponding to a joint touched on, after moving a part selected from the part screen to the assembling tray; and
   an intermediate work assembling unit configured to assemble an intermediate work based on touch of the joint on partial works, after moving partial works selected from partial works assembled by the partial work assembling unit.

5. The apparatus for assembling the 3D model according to claim 4, wherein the intermediate work assembling unit repeatedly assembles an intermediate work sequentially selected to finish the 3D model out of the intermediate works and finish the assembling of the 3D model.

6. The apparatus for assembling the 3D model according to claim 1, wherein the apparatus is a tablet computer, a desk top computer, a smart phone or a note book.

7. The apparatus for assembling the 3D model according to claim 1, wherein the 3D model is a plastic model, a mechanical component model, an electronic component model, a molecular model having a 3D shape or mathematical figure model.

8. An apparatus for assembling the 3D model comprising:
   a menu screen configuration unit configured to configure a menu screen for 3D model assembling;
   an input sensing unit configured to sense user input touched on the menu screen by the user;
   a part configuration unit configured to provide screen of parts for a 3D model selected from the menu screen;
   a 3D model assembling unit configured to assemble the 3D model into a finished product by receiving parts selected from the part screen and performing assembling in successive steps based on touch input of joints connecting the parts with one another,
   wherein the 3D model assembling unit moves the parts selected from the part screen to an assembling tray for the assembling and performs the assembling in successive steps, corresponding to the touch input of the joints connecting the parts with one another,
   wherein one assembling tray is independently generated for each part selected from the part screen, and
   wherein the assembling tray comprises:
      a waiting tray configured to display the part, when a part is selected from the part screen;
      an independent tray configured to display a transformation into a state where the assembling of the parts is performed, when parts which will be assembled to be a partial work are moved from the waiting tray; and
      a finishing tray configured to display temporarily stored finished partial works when the parts are assembled to be the partial work in the independent tray.

9. The apparatus for assembling the 3D model according to claim 8, wherein assembling of parts is performed based on touch input of joints displayed on two parts as assembling objects in the independent tray.

10. The apparatus for assembling the 3D model according to claim 8, wherein assembling of parts is performed when one of the two parts is selected from the independent tray as the assembling object and dragged to the other one closely within a predetermined range of distances.

11. The apparatus for assembling the 3D model according to claim 8, further comprising:
   a 3D model information database (DB) configured to store information on the parts of the 3D model; and
   a 3D model finished work DB configured to store information on the finished work of the 3D model.

12. The apparatus for assembling the 3D model according to claim 11, wherein the part configuration unit provides the part screen based on part information of the selected 3D model read from the 3D model information DB.

13. The apparatus for assembling the 3D model according to claim 8, wherein the 3D model assembling unit comprises,
   a partial work assembling unit configured to perform assembling, corresponding to a joint touched on, after moving a part selected from the part screen to the assembling tray; and
   an intermediate work assembling unit configured to assemble an intermediate work based on touch of the joint on partial works, after moving partial works selected from partial works assembled by the partial work assembling unit.

14. The apparatus for assembling the 3D model according to claim 13, wherein the intermediate work assembling unit repeatedly assembles an intermediate work sequentially selected to finish the 3D model out of the intermediate works and finish the assembling of the 3D model.

15. The apparatus for assembling the 3D model according to claim 8, wherein the 3D model is a plastic model, a mechanical component model, an electronic component model, a molecular model having a 3D shape or mathematical figure model.

16. A method for assembling a 3D model comprising:
   receiving input of a request to implement an application for 3D model assembling;
   displaying a menu screen for the 3D model assembling by driving the application requested to implement;
   receiving selection of a 3D model as an assembling object from the menu screen;
   displaying a screen of parts for the selected 3D model; and
   assembling the 3D model, using the parts selected from the part screen,
   wherein the assembling of the 3D model comprises:
      generating a screen of parts for the 3D model selected from the menu screen;
      receiving input of parts selected from the part screen; and
      assembling the 3D model into a finished product by in successive steps performing the assembling based on touch input of joints connecting the selected parts with one another,
   wherein the assembling of the 3D model into the finished product comprises,
      assembling a partial work based on touch on joints on parts, after moving the parts selected from the part screen to an assembling tray;
      assembling an intermediate work based on touch of the joints touched on, after moving the partial work selected from the assembled partial works; and finishing the assembling of the 3D model by repeatedly assembling the intermediate work sequentially selected out of the intermediate works to finish the 3D model, wherein a single assembling tray is independently generated for each of the parts selected from the part screen, wherein the assembling tray comprises:

a waiting tray configured to display the part, when a part is selected from the part screen;

an independent tray configured to display a transformation into a state where the assembling of the parts is performed, when parts which will be assembled to be a partial work are moved from the waiting tray; and a finishing tray configured to display temporarily stored finished partial works when the parts are assembled to be the partial work in the independent tray.

17. The method for assembling the 3D model according to claim 16, wherein the 3D model is a plastic model, a mechanical component model, an electronic component mode, a molecular model having a 3D shape or mathematical figure model.

\* \* \* \* \*